US010833621B2

(12) United States Patent
Fujita et al.

(10) Patent No.: US 10,833,621 B2
(45) Date of Patent: Nov. 10, 2020

(54) DRIVE CONTROL DEVICE FOR ELECTRIC MOTOR AND DRIVE CONTROL METHOD FOR SAME

(71) Applicant: HITACHI AUTOMOTIVE SYSTEMS, LTD., Hitachinaka (JP)

(72) Inventors: Haruhiko Fujita, Isesaki (JP); Hirofumi Watanabe, Isesaki (JP)

(73) Assignee: HITACHI AUTOMOTIVE SYSTEMS, LTD., Hitachinaka (JP)

(*) Notice: Subject to any disclaimer, the term of this patent is extended or adjusted under 35 U.S.C. 154(b) by 0 days.

(21) Appl. No.: 16/491,533

(22) PCT Filed: Feb. 28, 2018

(86) PCT No.: PCT/JP2018/007473
§ 371 (c)(1),
(2) Date: Sep. 5, 2019

(87) PCT Pub. No.: WO2018/163925
PCT Pub. Date: Sep. 13, 2018

(65) Prior Publication Data
US 2020/0036318 A1 Jan. 30, 2020

(30) Foreign Application Priority Data
Mar. 6, 2017 (JP) ................................ 2017-041675

(51) Int. Cl.
H02P 27/14 (2006.01)
G01R 31/50 (2020.01)
(Continued)

(52) U.S. Cl.
CPC .............. H02P 27/14 (2013.01); G01R 1/203 (2013.01); G01R 31/50 (2020.01); H02P 7/063 (2013.01); H02P 2209/05 (2013.01)

(58) Field of Classification Search
CPC ...... H02P 27/14; H02P 7/063; H02P 2209/05; G01R 31/50; G01R 1/203; H02M 7/48
See application file for complete search history.

(56) References Cited

U.S. PATENT DOCUMENTS 5,574,636 A    11/1996  Lee et al.
8,645,087 B2    2/2014  Doktar et al.
2011/0011633 A1  1/2011  Uchida et al.

FOREIGN PATENT DOCUMENTS

JP    H09-247951 A    9/1997
JP    H10-505218 A    5/1998
(Continued)

OTHER PUBLICATIONS

Office Action received in corresponding German Patent Application No. 112018001171.2 dated Jan. 13, 2020 with English Translation.

Primary Examiner — Kyle J Moody
(74) Attorney, Agent, or Firm — Foley & Lardner LLP

(57) ABSTRACT

A drive control device and a drive control method for electric motors are capable of detecting a leakage current in a multilayer wiring board without providing a current sensor. The drive control device has an inverter circuit mounted on the multilayer wiring board, and a shunt resistor for detecting a bus current in the inverter circuit. The upstream and downstream wiring portions of the inverter circuit are disposed facing each other in neighboring layers of the multilayer wiring board, with insulating layers interposed therebetween. The multilayer wiring board has a sensing pattern layer which guides, to the shunt resistor, the leakage current flowing from the upstream wiring portion to the downstream wiring portion, and the presence or absence of leakage current is determined based on the current flowing through the shunt resistor during the period in which the regenerative current is generated in the electric motor.

19 Claims, 5 Drawing Sheets

(51) Int. Cl.
*G01R 1/20* (2006.01)
*H02P 7/06* (2006.01)

(56) References Cited

FOREIGN PATENT DOCUMENTS

| | | |
|---|---|---|
| JP | 2000-102253 A | 4/2000 |
| JP | 2001-190086 A | 7/2001 |
| JP | 2014-147290 A | 8/2014 |

DRIVE CONTROL DEVICE FOR ELECTRIC MOTOR AND DRIVE CONTROL METHOD FOR SAME

TECHNICAL FIELD

The present invention relates to a drive control device for electric motors in which an inverter circuit and a shunt resistor for detecting a bus current are mounted on a multilayer wiring board, and relates to a drive control method for the same.

BACKGROUND ART

Patent Document 1 discloses a power converter in which wiring of a main circuit is constituted by a wiring board having multiple layers stacked one on another. A plurality of positive and negative DC main circuit conductors of the power converter are respectively provided in the wiring board, and these positive and negative DC main circuit conductors are alternately laminated with insulating layers sandwiched therebetween.

REFERENCE DOCUMENT LIST

Patent Document

Patent Document 1: JP 2000-102253 A

SUMMARY OF THE INVENTION

Problem to be Solved by the Invention

In such a multilayer wiring board, due to heat load resulting from heat generated by mounted electronic components, aging and the like, the insulating layer between the wiring (DC main circuit conductors) deteriorates, and a leakage current may occur between the wiring with the insulating layer sandwiched therebetween. In order to detect such a leakage current, a current sensor must be provided, and this increases product costs.

The present invention has been made in view of the above circumstances, and an object of the present invention is to provide a drive control device for an electric motor capable of detecting a leakage current of a multilayer wiring board without having to provide current sensor, and to provide a drive control method for the same.

Means for Solving the Problem

In a drive control device for an electric motor according to one aspect of the present invention, the drive control device includes: an inverter circuit configured to drive the electric motor; a shunt resistor for detecting a bus current in the inverter circuit; a multilayer wiring board on which the inverter circuit and the shunt resistor are mounted; an upstream wiring portion and a downstream wiring portion of the inverter circuit disposed facing each other in neighboring layers of the multilayer wiring board, the neighboring layers each having interposed therebetween an insulating layer; a sensing pattern layer that is provided on the multilayer wiring board, and that guides, to the shunt resistor, a leakage current flowing from the upstream wiring portion to the downstream wiring portion; and a control unit configured to input a Pulse Width Modulation (PWM) signal to the inverter circuit to perform control, and to determine a presence or an absence of the leakage current based on a current flowing through the shunt resistor during a period in which a regenerative current is generated in the electric motor.

Additionally, a drive control method for an electric motor according to another aspect of the present invention has an electric motor that includes an inverter circuit configured to drive the electric motor; a shunt resistor for detecting a bus current in the inverter circuit; a multilayer wiring board on which the inverter circuit and the shunt resistor are mounted; an upstream wiring portion and a downstream wiring portion of the inverter circuit disposed facing each other in neighboring layers of the multilayer wiring board, the neighboring layers each having interposed therebetween an insulating layer; a sensing pattern layer that is provided on the multilayer wiring board, and that guides, to the shunt resistor, a leakage current flowing from the upstream wiring portion to the downstream wiring portion; and a control unit configured to drive the electric motor, the method includes the steps of inputting and controlling a Pulse Width Modulation (PWM) signal from the control unit to the inverter circuit to drive the electric motor; and determining, by the control unit, a presence or an absence of the leakage current based on a current flowing through the shunt resistor during a period in which a regenerative current is generated in the electric motor.

Effects of the Invention

In the present invention, a leakage current is detected using a sensing pattern layer provided in a multilayer wiring board and a shunt resistor for detecting a bus current. Since no current flows in the shunt resistor during a period in which a regenerative current is generated in an electric motor, it is possible to determine the presence or absence of the leakage current by detecting whether or not the current flows during this period.

Therefore, according to the present invention, the leakage current in the multilayer wiring board can be detected without having to provide a current sensor, and increase in product cost can be avoided.

MODE FOR CARRYING OUT THE INVENTION

Hereinafter, an embodiment of the present invention will be described with reference to the drawings.

Figure 1:
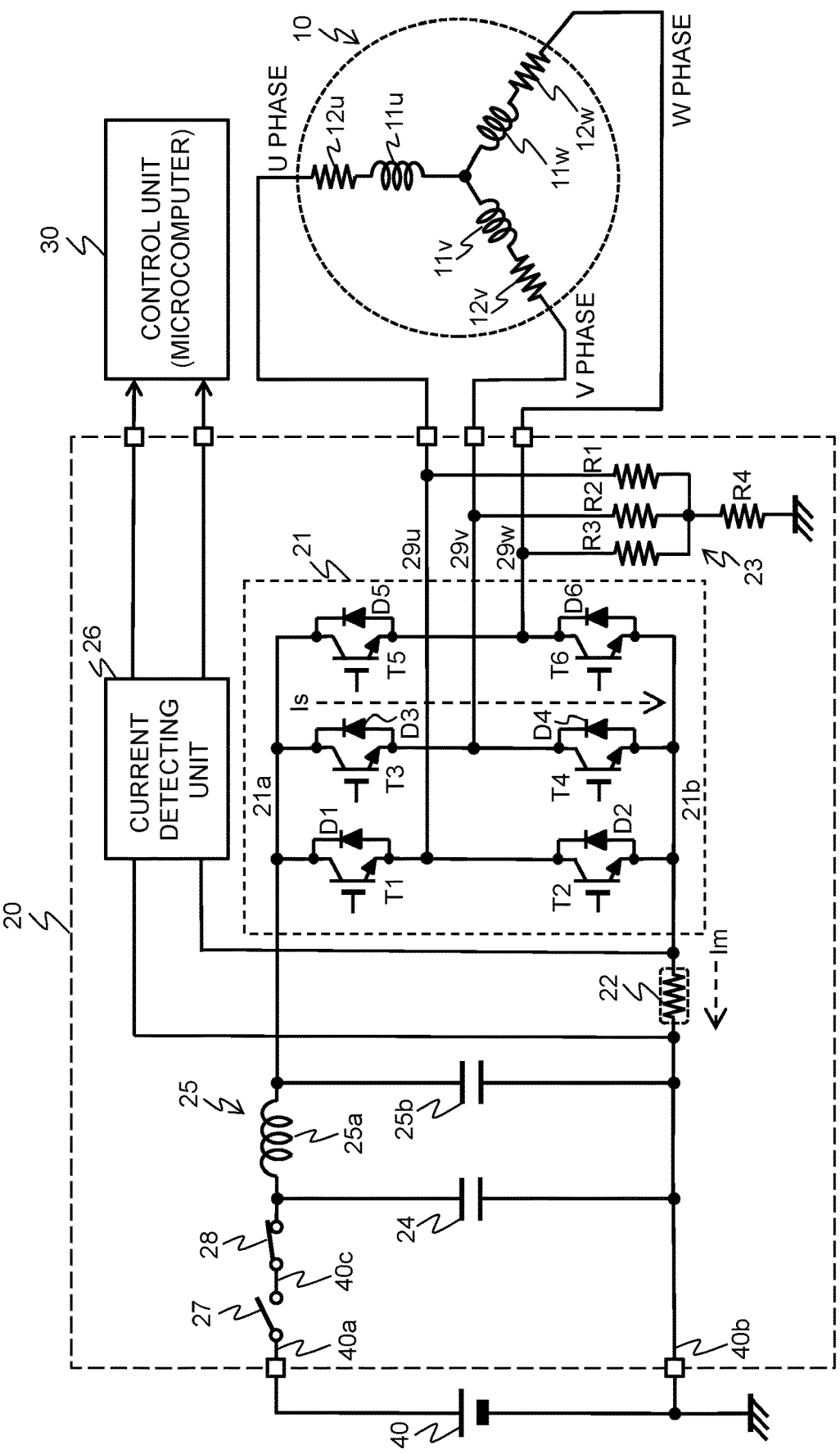
FIG. 1 is a circuit diagram showing a schematic configuration of a drive control device of an electric motor according to an embodiment of the present invention.

FIG. 1 shows the schematic configuration of the drive control device of the electric motor according to an embodiment of the present invention, in which the main parts related to the detection of leakage current generated between the wiring patterns of the multilayer wiring board are extracted.

In this example, an electric motor 10 which is to be controlled is a three-phase DC brushless motor equipped with U-phase, V-phase and W-phase three-phase coils 11$u$, 11$v$, and 11$w$ which are star-connected to a cylindrical stator (not shown). The permanent magnet rotator (rotor) is rotatably provided in a space formed at the central portion of the stator. Current sensors 12$u$, 12$v$, and 12$w$ for detecting the current (phase current) flowing through three-phase coils 11$u$, 11$v$, and 11$w$ are series-connected, respectively, to three-phase coils 11$u$, 11$v$, and 11$w$. Electric motor 10 is drive-controlled by being supplied with a Pulse Width Modulation (PWM) signal from the drive control device.

The drive control device is constituted by the electronic components mounted on a multilayer wiring board 20 and a control unit 30 such as the microcomputer. The electronic components such as an inverter circuit 21, a shunt resistor 22, a phase voltage detector 23, a smoothing capacitor 24, a filter circuit 25, a current detecting unit 26, a shut-off relay 27 and a backflow prevention relay 28 are mounted on multilayer wiring board 20 by soldering, for example.

Figure 2:
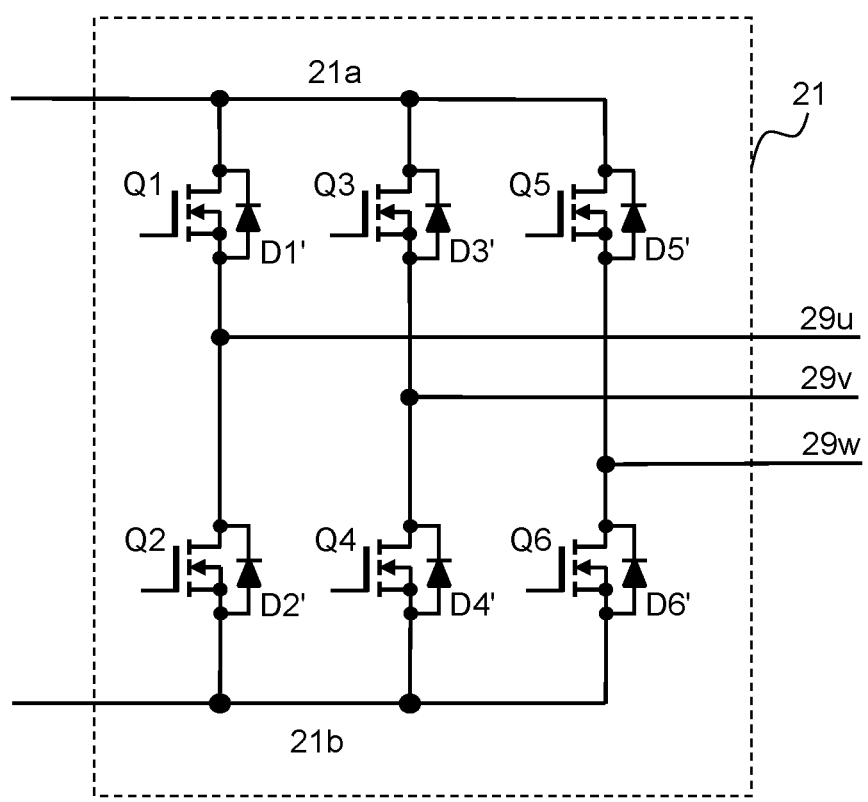
FIG. 2 is a circuit diagram showing another configuration example of an inverter circuit in the drive control device of the electric motor shown in FIG. 1.

Inverter circuit 21 is constituted by three-phase bridge-connected switching elements T1 to T6. Although each of switching elements T1 to T6 uses an insulated gate bipolar transistor (IGBT) in this example, other semiconductor devices for controlling electric power, such as field effect transistors (FETs) Q1 to Q6, may be used, as shown in FIG. 2. Between the collector and the emitter of each IGBT, the cathode and the anode of a corresponding diode D1 to D6 are connected in a manner such that the energization direction is reversed. In the case of the FETs, parasitic diodes D1' to D6' are formed in the drain and source regions.

Between an upstream wiring portion 21$a$ and a downstream wiring portion 21$b$ of inverter circuit 21, the operating power is supplied from a DC power supply 40 such as the battery via shut-off relay 27 provided on an electric wire 40$a$ for power supplies (hotline), backflow prevention relay 28, and filter circuit 25 for noise removal. Here, filter circuit 25 is of LC type constituted by an inductor 25$a$ and a capacitor 25$b$. Additionally, between the positive electrode and the negative electrode of DC power supply 40, smoothing capacitor 24 is connected via shut-off relay 27 and backflow prevention relay 28.

The output of control unit 30 is supplied (not shown) to the control terminals (gate electrodes) of switching elements T1 to T6 in inverter circuit 21. The on and off of switching elements T1 to T6 are controlled by PWM so that the voltage (motor input voltage) applied to electric motor 10 is controlled.

The voltages of the U-phase, V-phase and W-phase of electric motor 10 are respectively detected by phase voltage detector 23. Phase voltage detector 23 is constituted by resistors R1 to R3 having one ends connected to U-phase, V-phase and W-phase drive lines 29$u$, 29$v$ and 29$w$, respectively, and a resistor R4 connected between the other ends of resistors R1 to R3 and the ground. The phase voltage is output from the junction of resistors R1 to R3 and resistor R4. This phase voltage is supplied to control unit 30 and is used for controlling switching elements T1 to T6.

One end of shunt resistor 22 is connected to downstream (ground side) wiring portion 21$b$ of inverter circuit 21, and the other end is connected to the negative electrode of DC power supply 40 via a wire for ground (cold line) 40$b$. Shunt resistor 22 is provided for detecting a bus current Im flowing through downstream wiring portion 21$b$ of inverter circuit 21 and for controlling the rotation of electric motor 10.

Additionally, in the present embodiment, shunt resistor 22 is also used for detecting a leakage current Is which flows through the insulating layers interposed between upstream wiring portion 21$a$ and downstream wiring portion 21$b$ of inverter circuit 21. The voltage across shunt resistor 22 is supplied to current detecting unit 26 for detecting the current flowing through the shunt resistor, and the voltage for motor control and for short circuit current detection is supplied to the A/D converter which is incorporated in control unit 30.

Figure 3:
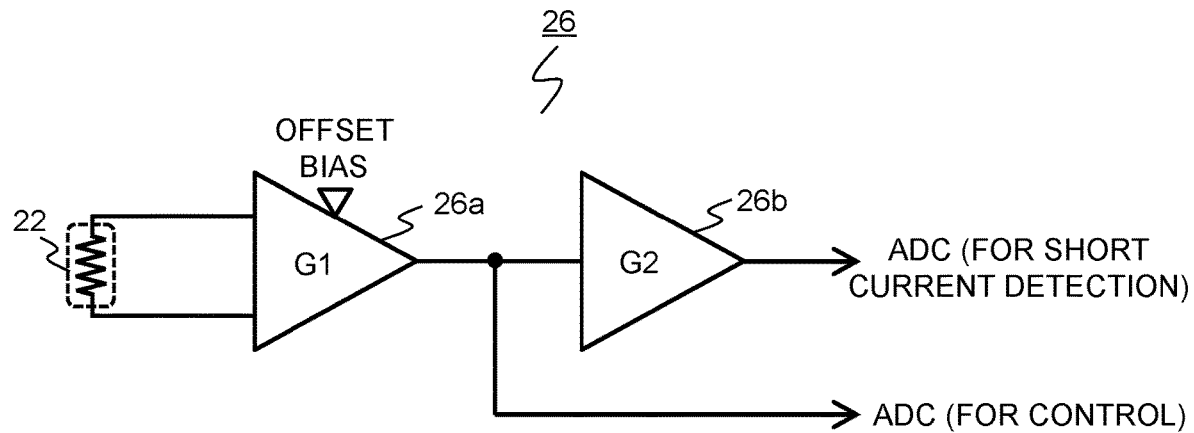
FIG. 3 is a circuit diagram showing a configuration example of a current detecting unit in the drive control device of the electric motor shown in FIG. 1.

FIG. 3 shows the configuration example of current detecting unit 26 in the drive control device of electric motor 10 shown in FIG. 1. Here, current detecting unit 26 constituted by an amplifier 26$a$ of gain G1 and an amplifier 26$b$ of gain G2 (gain G1>G2) is shown as the example. The voltage generated across shunt resistor 22 is amplified by amplifier 26$a$. The offset bias voltage is applied to amplifier 26$a$. The output signal of amplifier 26$a$ for controlling electric motor 10 is supplied to the A/D converter (ADC) in control unit 30 as the signal to be used for controlling electric motor 10. Additionally, the output signal of amplifier 26$a$ which is further amplified by amplifier 26$b$ is supplied to the A/D converter (ADC) in control unit 30 as the signal to be used for short current detection.

By using two-stage amplifiers 26$a$ and 26$b$ as described above to increase the gain, leakage current Is which is detected by shunt resistor 22 can be monitored with high resolution and high accuracy. In particular, since the short circuit current flowing through the insulating layers is small, amplifying the signal by two-stage amplifiers 26$a$ and 26$b$ enables detection of even a small leakage current that is close to the limit of detection accuracy if a current sensor were provided.

FIGS. 4 to 7 respectively show the wiring patterns of the first to fourth layers of multilayer wiring board 20 in the drive control device of electric motor 10 shown in FIG. 1. An insulating layer is interposed between each pair of wiring patterns, that is, between the first and second layer, between the second and third layer, and between the third and fourth layer wiring patterns. The wiring patterns of the neighboring layers are disposed facing each other.

Figure 4:
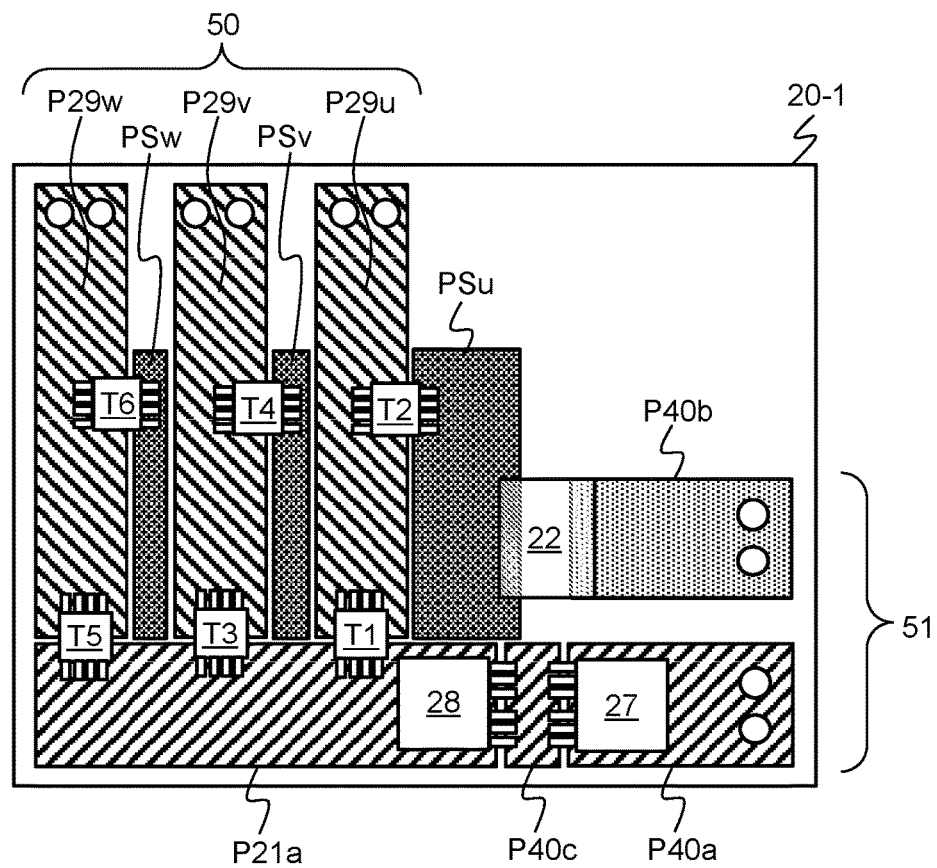
FIG. 4 is a plan view of a first-layer wiring pattern of a multilayer wiring board in the drive control device of the electric motor shown in FIG. 1.

A first layer wiring pattern 20-1 shown in FIG. 4 serves as the mounting surface for the electronic components. Switching elements T1 to T6, shunt resistor 22, shut-off relay 27, and backflow prevention relay 28 and the like are mounted on wiring pattern 20-1.

Here, for simplicity of illustration, phase voltage detector 23, smoothing capacitor 24, filter circuit 25, current detecting unit 26 and the like are omitted.

First-layer wiring pattern 20-1 is provided with pattern portions P29$u$, P29$v$ and P29$w$ corresponding to U-phase, V-phase and W-phase drive lines 29$u$, 29$v$ and 29$w$ of electric motor 10, and sensing pattern layers PSu, PSv and PSw disposed adjacent to pattern portions P29$u$, P29$v$ and P29$w$. The collectors of switching elements T2, T4 and T6 are connected to pattern portions P29$u$, P29$v$ and P29$w$, respectively, and the emitters of switching elements T2, T4 and T6 are connected to sensing pattern layers PSu, PSv and PSw, respectively. Electric motor 10 is connected to pattern portions P29$u$, P29$v$ and P29$w$ via a connector 50 for motor connection.

A pattern portion P40$b$ corresponding to a ground wire 40$b$ is separately disposed in sensing pattern layer PSu, and sensing pattern layer PSu and pattern portion P40$b$ are electrically connected to each other via shunt resistor 22. Sensing pattern layers PSu, PSv and PSw respectively detect the leakage failure of the electronic components in inverter circuit 21, for example, the ON failure of switching elements T1 to T6. The ON failure is detected when any of switching elements T1-T6 remains in the ON state and the current continues to flow at the timing when the switching element is supposed to be turned off.

For example, when control unit 30 detects that the current value flowing through shunt resistor 22 exceeds the second predetermined value which is greater than the first predetermined value for leakage current detection, current detecting unit 26 determines that the switching element had failed to be turned off. In this case, a large current may flow, causing abnormal heat generation and burnout of inverter circuit 21 and other electronic components, and thus, control unit 30 turns off shut-off relay 27 to immediately stop driving electric motor 10.

Additionally, the emitters of switching elements T1, T3 and T5 are connected to pattern portions P29u, P29v and P29w, respectively, and the collectors of switching elements T1, T3 and T5 are connected to a pattern portion P21a corresponding to upstream wiring portion 21a of inverter circuit 21. A pattern portion P40a corresponding to electric wire 40a for power supplies is disposed adjacent to pattern portion P21a corresponding to upstream wiring portion 21a to sandwich a pattern portion P40c therebetween. Pattern portion P40c corresponds to the wire that connects shut-off relay 27 and backflow prevention relay 28. Pattern portion P40a and pattern portion P40c are connected via shut-off relay 27, and pattern portion P40c and pattern portion P21a are connected via backflow prevention relay 28. A connector 51 for power supply line connection in order to connect to DC power supply 40 is connected to pattern portion P40a and pattern portion P40b.

Figure 5:
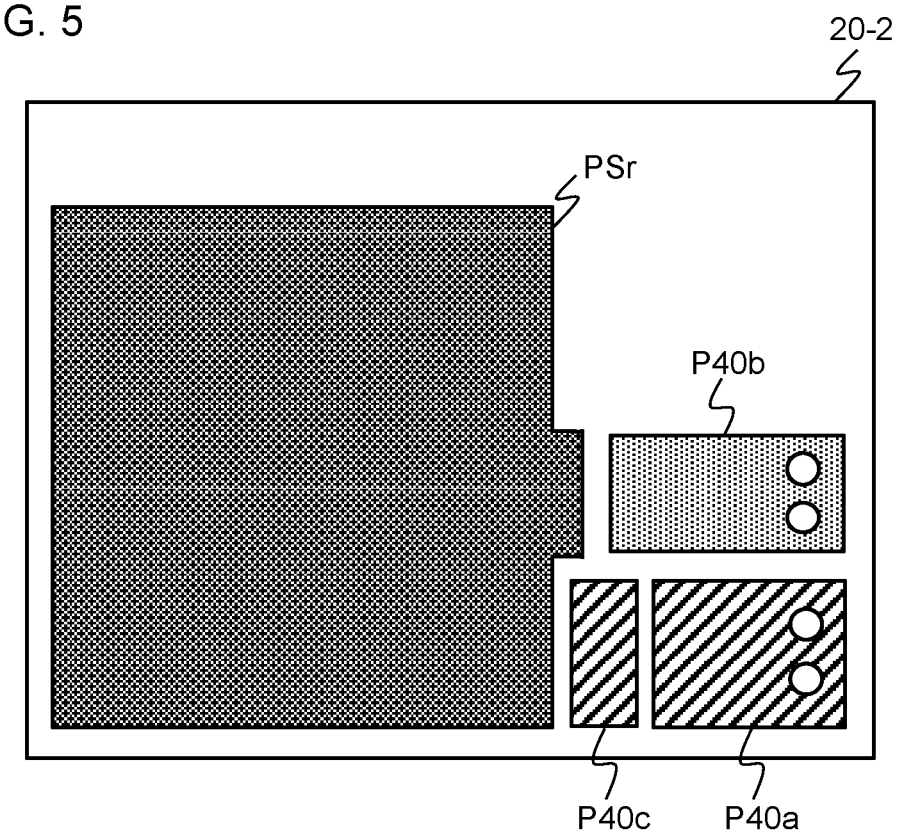
FIG. 5 is a plan view of a second-layer wiring pattern of the multilayer wiring board shown in FIG. 1.

A second layer wiring pattern (inner layer 1) 20-2 shown in FIG. 5 is provided with a sensing pattern layer PSr that faces, through the insulating layer (not shown), pattern portions P29u, P29v and P29w, sensing pattern layers PSu, PSv and PSw, and pattern portion P21a of the first layer. Sensing pattern layer PSr has a larger area than these patterns. Sensing pattern layer PSr detects the leakage current which is generated in the insulating layers between the first and third layer wiring patterns, and is connected to pattern portion P40b corresponding to ground wire 40b via shunt resistor 22. This sensing pattern layer PSr and sensing pattern layers PSu, PSv and PSw are connected via the through holes to form downstream wiring portion 21b of inverter circuit 21, and the current flowing through downstream wiring portion 21b is guided to one end of shunt resistor 22.

Additionally, pattern portion P40a of electric wire 40a for power supplies and pattern portion P40c are disposed at the location corresponding to first layer wiring pattern 20-1.

Figure 6:
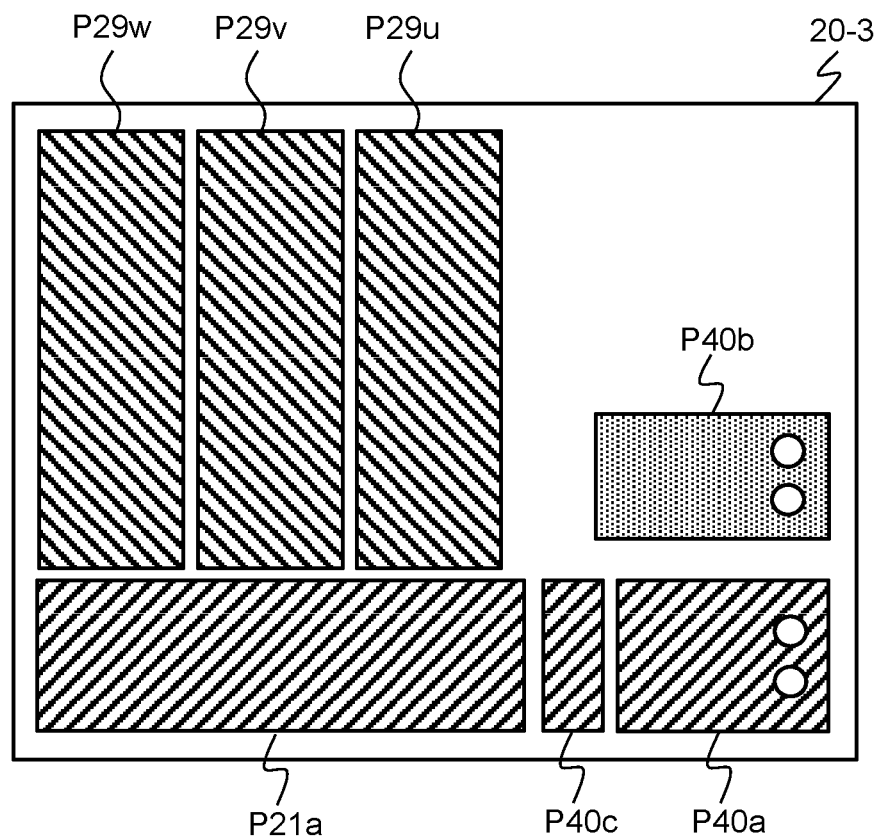
FIG. 6 is a plan view of a third-layer wiring pattern of the multilayer wiring board shown in FIG. 1.

On a third layer wiring pattern (inner layer 2) 20-3 shown in FIG. 6, pattern portions P29u, P29v, and P29w are disposed at the location corresponding to pattern portions P29u, P29v, and P29w of first layer wiring pattern 20-1. Pattern portions P29u, P29v, and P29w of third layer wiring pattern 20-3 have larger areas than those of first layer wiring pattern 20-1. Additionally, pattern portions P40a, P40c, P21a and P40b corresponding to those of the first and second layers are disposed.

Figure 7:
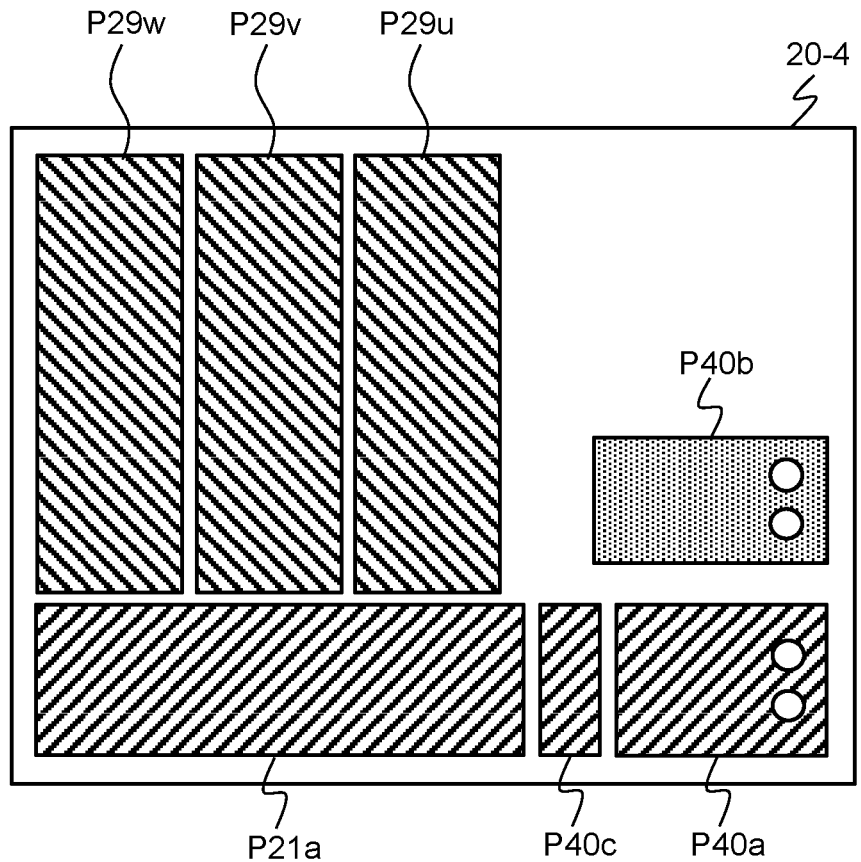
FIG. 7 is a plan view of a fourth-layer wiring pattern of the multilayer wiring board shown in FIG. 1.

Pattern portions P29u, P29v and P29w which are the same as those of the third layer are disposed on a fourth layer (solder surface) wiring pattern 20-4 shown in FIG. 7. Additionally, pattern portions P40a, P40c, P21a and P40b are disposed.

Inverter circuit 21, shunt resistor 22, shut-off relay 27, backflow prevention relay 28 and the like are mounted on wiring pattern 20-4 by soldering.

DC power supply 40 is applied to pattern portions P40a and P40b in first to fourth layer wiring patterns 20-1 to 20-4 of multilayer wiring board 20 via connector 51. DC power supply 40 is supplied to pattern portion P21a via shut-off relay 27 and backflow prevention relay 28, and is also supplied from pattern portion P40b to sensing pattern layers PSu, PSv, PSw and PSr via shunt resistor 22. As a result, the operating power is supplied between upstream wiring portion 21a and downstream wiring portion 21b of inverter circuit 21, and the PWM signal according to the on-off state of switching elements T1 to T6 is supplied to pattern portions P29u, P29v and P29w corresponding to drive lines 29u, 29v and 29w. Then, electric motor 10 connected to pattern portions P29u, P29v and P29w by connector 50 is driven by PWM control.

Figure 8:
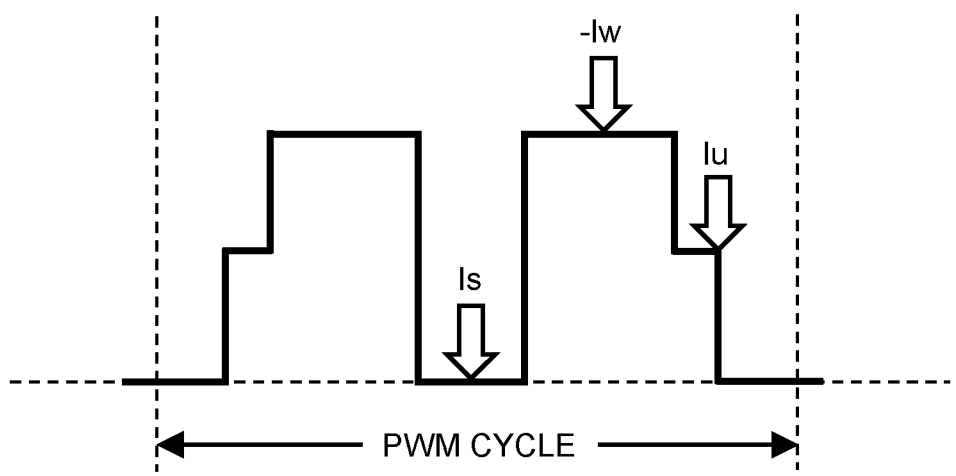
FIG. 8 is a waveform diagram showing the detection timing of a leakage current in the drive control device of the electric motor shown in FIG. 1.

Next, the operation for detecting the leakage current in the above-described configuration will be described. FIG. 8 shows the detection timing of leakage current Is in the drive control device of the electric motor shown in FIG. 1. In one PWM cycle, only two-phase bus currents can be detected, and the remaining one phase is estimated from the sum of each current being "0". FIG. 8 shows an example in which a W-phase current –Iw and a U-phase current Iu are detected at the timings indicated by the arrows, and the voltage detected by shunt resistor 22 is supplied from current detecting unit 26 to the A/D converter in control unit 30 so as to be digitized. Control unit 30 obtains W-phase current –Iw and U-phase current Iu from the digitized voltage. Control unit 30 calculates a V-phase current Iv from the relationship of "Iu+Iv+Iw=0".

In the present embodiment, the presence or absence of leakage current is determined based on the current flowing through shunt resistor 22 during the period in which the regenerative current is generated in electric motor 10 in the PWM cycle. That is, bus current Im does not normally flow during the PWM-control regeneration period. However, the current flows, when, for example, the insulating layers which are interposed between first and third layer wiring patterns 20-1 and 20-3 in multilayer wiring board 20 are degraded and carbonized to form the path of leakage current Is. Leakage current Is is received by sensing pattern layer PSr and is guided to shunt resistor 22. Then, during the period in which the regenerative current is generated in electric motor 10, the voltage across shunt resistor 22 is amplified and supplied to the A/D converter in control unit 30 so that the voltage is digitized and detected.

Specifically, when the current flows through shunt resistor 22, for example, when the current value of this current continues to be equal to or greater than the first predetermined value for a predetermined period, then it is determined that the leakage current exists. Here, the greater the current value detected by shunt resistor 22, the shorter the predetermined period is, and the first predetermined value is the current value that is less than the maximum current for driving electric motor 10. Such data may be stored in advance in the storage device in control unit 30, and may be referred to for determination of when leakage current is detected.

Furthermore, when the value of the current flowing through shunt resistor 22 exceeds the second predetermined value which is greater than the first predetermined value, the abnormal heat generation of multilayer wiring board 20 and burnout of the electronic parts can be suppressed by turning off shut-off relay 27 to shut the supply of DC power supply 40 off so as to immediately stop driving electric motor 10.

According to the above configuration, since leakage current Is can be detected by using shunt resistor 22 for detecting the bus current during the period when the regenerative current is generated in electric motor 10, the current sensor need not be provided. Sensing pattern layer PSr can form the conductor pattern when forming multilayer wiring board 20, for example, when forming upstream wiring portion 21a or downstream wiring portion 21b, and thus, increased cost of the product can be avoided.

Furthermore, the above configuration can also detect the ON failure, in which any of switching elements T1 to T6 in inverter circuit 21 remains in the ON state and the current continues to flow at the timing when the switching element is supposed to be turned off. Moreover, there can be obtained an effect that sensing pattern layer PSr which has a large area and is electrically grounded via the shunt resistor is interposed between the two wiring portions 21a and 21b so that the electromagnetic radiation noise emitted from the multilayer wiring substrate 20 can be shielded and suppressed.

In the above embodiment, the downstream shunt method which uses shunt resistor 22 provided on the ground side of inverter circuit 21 to detect leakage current Is has been described as the example. However, the present invention is also applicable to the upstream shunt method that detects the bus current on the power supply side.

Additionally, the arrangement and shapes of sensing pattern layers PSu, PSv, PSw and PSr are merely examples, and it is of course possible that they can be deformed into various shapes and sizes according to the required characteristics.

Furthermore, although the above embodiment describes the example in which control unit 30 is provided separately from multilayer wiring board 20, control unit 30 may also be mounted on multilayer wiring board 20.

Although the present invention has been described using the above embodiment, the present invention is not limited to the above embodiment, and various modifications in the implementation stage can be made without departing from the gist of the invention. The above embodiment includes the invention at various stages, and various inventions may be extracted by appropriately combining the plurality of disclosed features. Even if, for example, some features are omitted from all the features shown in the embodiment, if at least one of the problems disclosed in Problem to be Solved by the Invention can be solved and at least one of the effects which is disclosed in Effects of the Invention can be obtained, then the configuration from which such features are omitted may be extracted as the invention.

REFERENCE SYMBOL LIST

10 Electric motor
11u, 11v, 11w Three-phase coil
20 Multilayer wiring board
20-1 to 20-4 Wiring pattern
21 Inverter circuit
21a Upstream wiring portion
21b Downstream wiring portion
22 Shunt resistor
26 Current detecting unit
30 Control unit (Microcomputer)
T1 to T6 Switching element
PSu, PSv, PSw, PSr Sensing pattern layer
Is Leakage current
Im Bus current

The invention claimed is:

1. A drive control device for an electric motor, comprising:
    an inverter circuit configured to drive the electric motor;
    a shunt resistor for detecting a bus current in the inverter circuit;
    a multilayer wiring board on which the inverter circuit and the shunt resistor are mounted;
    an upstream wiring portion and a downstream wiring portion of the inverter circuit disposed facing each other in neighboring layers of the multilayer wiring board, the neighboring layers each having interposed therebetween an insulating layer;
    a sensing pattern layer that is provided on the multilayer wiring board, and that guides, to the shunt resistor, a leakage current flowing from the upstream wiring portion to the downstream wiring portion; and
    a control unit configured to input a Pulse Width Modulation (PWM) signal to the inverter circuit to perform control, and to determine a presence or an absence of the leakage current based on a current flowing through the shunt resistor during a period in which a regenerative current is generated in the electric motor.

2. The drive control device for the electric motor according to claim 1, wherein the sensing pattern layer is provided in the insulating layer between the upstream wiring portion and the downstream wiring portion, and is electrically connected to one end of the shunt resistor.

3. The drive control device for the electric motor according to claim 1, wherein when the current flows through the shunt resistor during the period in which the regenerative current is generated in the electric motor, the control unit determines that the leakage current exists when a current value continues to be equal to or greater than a first predetermined value for a predetermined period.

4. The drive control device for the electric motor according to claim 3, wherein the greater the current value detected by the shunt resistor, the shorter the predetermined period is.

5. The drive control device for the electric motor according to claim 3, wherein the first predetermined value is the current value that is less than the maximum current for driving the electric motor.

6. The drive control device for the electric motor according to claim 3, wherein the control unit immediately stops driving of the electric motor when the current value flowing through the shunt resistor exceeds a second predetermined value that is greater than the first predetermined value.

7. The drive control device for the electric motor according to claim 1, wherein either one of the upstream wiring portion or the downstream wiring portion of the inverter circuit which performs current detection by the shunt resistor has a larger area than the wiring portion which does not perform the current detection.

8. The drive control device for the electric motor according to claim 1, further comprising a phase voltage detector for detecting U-phase, V-phase and W-phase voltages of the electric motor, wherein a phase voltage output from the phase voltage detector is supplied to the control unit, and is used to control a switching element constituting the inverter circuit.

9. The drive control device for the electric motor according to claim 8, wherein the phase voltage detector includes first to third resistors having one ends connected to U-phase, V-phase and W-phase drive lines of the electric motor respectively, and a fourth resistor connected between the other ends of the first to third resistors and a ground, and wherein the phase voltage is output from a junction of the first to third resistors and the fourth resistor.

10. The drive control device for the electric motor according to claim 1, further comprising a current detecting unit for detecting the current flowing through the shunt resistor, wherein a first voltage for motor control which is output from the current detecting unit and a second voltage for short current detection are supplied to the control unit.

11. The drive control device for the electric motor according to claim 10, wherein the current detecting unit includes a first amplifier that amplifies a voltage generated across the shunt resistor by a first gain, and a second amplifier that amplifies an output signal of the first amplifier by a second gain which is smaller than the first gain, the output signal of the first amplifier is supplied to the control unit as the output signal for controlling the electric motor, and an output signal of the second amplifier is supplied to the control unit as the output signal for short current detection.

12. The drive control device for the electric motor according to claim 11, wherein an offset bias voltage is applied to the first amplifier.

13. The drive control device for the electric motor according to claim 11, wherein the control unit includes an A/D converter to which the output signal of the first amplifier and the output signal of the second amplifier are supplied.

14. A drive control method for an electric motor, comprising an inverter circuit configured to drive the electric motor; a shunt resistor for detecting a bus current in the inverter circuit; a multilayer wiring board on which the inverter circuit and the shunt resistor are mounted; an upstream wiring portion and a downstream wiring portion of the inverter circuit disposed facing each other in neighboring layers of the multilayer wiring board, the neighboring layers each having interposed therebetween an insulating layer; a sensing pattern layer that is provided on the multilayer wiring board, and that guides, to the shunt resistor, a leakage current flowing from the upstream wiring portion to the downstream wiring portion; and a control unit configured to drive the electric motor, the method comprising the steps of:
inputting and controlling a Pulse Width Modulation (PWM) signal from the control unit to the inverter circuit to drive the electric motor; and
determining, by the control unit, a presence or an absence of the leakage current based on a current flowing through the shunt resistor during a period in which a regenerative current is generated in the electric motor.

15. The drive control method for the electric motor according to claim 14, wherein when the current flows through the shunt resistor during the period in which the regenerative current is generated in the electric motor, the control unit determines that the leakage current exists when a current value continues to be equal to or greater than a first predetermined value for a predetermined period.

16. The drive control method for the electric motor according to claim 15, wherein the greater the current value detected by the shunt resistor, the shorter the predetermined period is.

17. The drive control method for the electric motor according to claim 15, wherein the first predetermined value is the current value that is less than the maximum current for driving the electric motor.

18. The drive control method for the electric motor according to claim 15, wherein the control unit immediately stops driving of the electric motor when the current value flowing through the shunt resistor exceeds a second predetermined value that is greater than the first predetermined value.

19. The drive control method for the electric motor according to claim 14, wherein the control unit detects two-phase bus currents of the electric motor in one PWM cycle, and estimates the remaining one phase from the sum of each current being "0".

* * * * *